(12) United States Patent
Wang et al.

(10) Patent No.: US 7,338,892 B2
(45) Date of Patent: Mar. 4, 2008

(54) CIRCUIT CARRIER AND MANUFACTURING PROCESS THEREOF

(75) Inventors: Yung-Hui Wang, Kaohsiung (TW); Ching-Fu Horng, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 0 days.

(21) Appl. No.: 11/309,020

(22) Filed: Jun. 9, 2006

(65) Prior Publication Data

US 2007/0287281 A1    Dec. 13, 2007

(51) Int. Cl.
*H01L 21/4763* (2006.01)
*H01L 21/44* (2006.01)
*H01L 21/48* (2006.01)
*H01L 21/50* (2006.01)
*H01L 21/31* (2006.01)

(52) U.S. Cl. .................. 438/618; 438/106; 438/761

(58) Field of Classification Search .............. 438/106, 438/618, 686, 761, 124; 257/723, 774, 778
See application file for complete search history.

(56) References Cited

U.S. PATENT DOCUMENTS

| 6,185,122 B1 | 2/2001 | Johnson et al. ............. 365/103 |
| 6,248,959 B1* | 6/2001 | Sylvester .................... 174/256 |
| 2005/0255303 A1* | 11/2005 | Sawatari et al. ............ 428/209 |
| 2006/0118931 A1* | 6/2006 | Ho et al. .................... 257/678 |
| 2006/0128069 A1* | 6/2006 | Hsu ........................... 438/124 |

* cited by examiner

*Primary Examiner*—Chuong Anh Luu
(74) *Attorney, Agent, or Firm*—Jianq Chyun IP Office

(57) ABSTRACT

A circuit carrier including a core layer, a passive component, a plurality of dielectric layers, and a plurality of circuit layers is provided. The core layer has a first surface and a second surface. In addition, the core layer has a hole, and the passive component is embedded in the hole of the core layer. Furthermore, the circuit layers and the dielectric layers are alternately disposed on the first surface and the second surface of the core layer respectively. The dielectric layers have a plurality of conductive vias, and at least one of the circuit layers is electrically connected to the passive component through the conductive vias. As described above, the electrical performance of the circuit carrier is enhanced. Furthermore, a manufacturing process of the circuit carrier mentioned above is also provided.

10 Claims, 7 Drawing Sheets

CIRCUIT CARRIER AND MANUFACTURING PROCESS THEREOF

BACKGROUND OF THE INVENTION

1. Field of Invention

The present invention relates to a circuit carrier and a manufacturing processing thereof. More particular, the present invention relates to a circuit carrier having an embedded passive component and a manufacturing process thereof.

2. Description of Related Art

With the progress of electronic technology, humanistic electronic products with better performance have been developed, and the electronic products are designed to be light, thin, short, small, and chic. As the line pitch is shortened, the cross talk generated during the switching of high-frequency signals is becoming serious. Usually, in order to improve the transmission quality of signals, passive components are added onto a package substrate or a printed circuit board (PCB).

With the increase of wiring intensity, the passive components are gradually integrated into the internal circuit of the circuit board. However, this type of passive components does not have high electrical performance. In other words, a different circuit layout must be designed to form the passive components with particular electrical specifications. Moreover, if the passive components are directly disposed on the surface of a circuit board, the area on the surface of the circuit board for other components is occupied. In particular, the passive components are usually disposed on the surface of the circuit board with surface mounting technology (SMT), which further leads to the degradation of the electrical performance of the circuit board.

SUMMARY OF THE INVENTION

Accordingly, the present invention is directed to provide a manufacturing method of a circuit carrier, such that a circuit carrier having an embedded passive component is formed.

In addition, the present invention is directed to provide a circuit carrier so as to increase the area for disposing electronic components.

As embodied and broadly described herein, the present invention provides a manufacturing process of a circuit carrier. Firstly, a core layer having a hole is provided. The core layer has a first surface and a second surface. A passive component is embedded in the hole. Then, a plurality of dielectric layers and a plurality of circuit layers are alternately formed on the first surface and the second surface of the core layer, and a plurality of conductive vias is formed in the dielectric layers. At least one of the circuit layers is electrically connected to the passive component through the conductive vias.

According to a preferred embodiment of the present invention, the hole of the core layer is, for example, a through hole or a blind hole.

According to a preferred embodiment of the present invention, the aforementioned method of forming the vias in the core layer is, for example, mechanical drilling or laser drilling.

According to a preferred embodiment of the present invention, the aforementioned method of forming the circuit layer on the core layer comprises alternately forming at least one first circuit layer and a part of the dielectric layers on the first surface of the core layer, wherein the passive component is electrically connected to the first circuit layer through the conductive vias. Thereafter, at least one second circuit layer and other part of the dielectric layers are alternately formed on the second surface of the core layer.

According to a preferred embodiment of the present invention, the method of forming the first circuit layer comprises laminating a conductive layer and a dielectric layer onto the first surface of the core layer, wherein the dielectric layer is disposed between the conductive layer and the core layer. Then, the conductive vias are formed in the dielectric layer, wherein the conductive vias are connected to the passive component. Thereafter, the conductive layer is patterned to form the first circuit layer. In particular, before laminating the conductive layer and the dielectric layer onto the core layer, a step of pre-laminating the conductive layer and the dielectric layer is further comprised.

According to a preferred embodiment of the present invention, the aforementioned method of forming the conductive vias comprises forming a plurality of blind holes in the dielectric layer, and then performing an electroplating process to form the conductive vias. In addition, the method of forming the blind holes is, for example, laser drilling.

According to a preferred embodiment of the present invention, the aforementioned method of forming the first circuit layer comprises laminating a dielectric layer onto the first surface of the core layer, and then forming a plurality of blind holes in the dielectric layer. Thereafter, a conductive layer is formed on the dielectric layer, so as to form the conductive vias in the blind holes, wherein the conductive vias are electrically connected to the passive component. Ultimately, the conductive layer is patterned to form the first circuit layer.

According to a preferred embodiment of the present invention, the aforementioned method of forming the blind holes is, for example, laser drilling.

According to a preferred embodiment of the present invention, the aforementioned method of forming the circuit layer comprises alternately forming at least one circuit layer and a part of the dielectric layers on the first surface of the core layer, and alternately forming at least one second circuit layer and other part of the dielectric layers on the second surface of the core layer. In particular, the passive component is electrically connected to the first circuit layer and the second circuit layer through the conductive vias.

According to a preferred embodiment of the present invention, the method of forming the first circuit layer comprises laminating a first conductive layer and a first dielectric layer onto the first surface of the core layer, wherein the first dielectric layer is disposed between the first conductive layer and the core layer. Then, a plurality of first conductive vias is formed in the first dielectric layer, wherein the first conductive vias are connected to the passive component. Thereafter, the first conductive layer is patterned to form the first circuit layer.

According to a preferred embodiment of the present invention, before laminating the first conductive layer and the first dielectric layer onto the core layer, a step of pre-laminating the first conductive layer and the first dielectric layer is further comprised.

According to a preferred embodiment of the present invention, the aforementioned method of forming the first conductive vias comprises forming a plurality of first blind holes in the first dielectric layer. Then, an electroplating process is performed to form the first conductive vias.

According to a preferred embodiment of the present invention, the aforementioned method of forming the first blind holes is, for example, laser drilling.

According to a preferred embodiment of the present invention, the aforementioned method of forming the first circuit layer comprises laminating a first dielectric layer onto the first surface of the core layer, and then forming a plurality of first blind holes in the dielectric layer. Then a first conductive layer is formed on the dielectric layer, so as to form a plurality of first conductive vias in the first blind holes, wherein the first conductive vias are electrically connected to the passive component. Thereafter, the first conductive layer is patterned to form the first circuit layer.

According to a preferred embodiment of the present invention, the aforementioned method of forming the first blind holes is, for example, laser drilling.

According to a preferred embodiment of the present invention, the method of forming the second circuit layer comprises laminating a second conductive layer and a second dielectric layer onto the second surface of the core layer, wherein the second dielectric layer is disposed between the second conductive layer and the core layer. Then, a plurality of second conductive vias is formed in the second dielectric layer, wherein the second conductive vias are electrically connected to the passive component. Thereafter, the second conductive layer is patterned to form the second circuit layer.

According to a preferred embodiment of the present invention, before laminating the second conductive layer and the second dielectric layer onto the core layer, a step of pre-laminating the second conductive layer and the second dielectric layer is further comprised.

According to a preferred embodiment of the present invention, the aforementioned method of forming the second conductive vias comprises forming a plurality of second blind holes in the second dielectric layer. Then an electroplating process is performed to form the second conductive vias.

According to a preferred embodiment of the present invention, the aforementioned method of forming the second blind holes is, for example, laser drilling.

According to a preferred embodiment of the present invention, the aforementioned method of forming the second circuit layer comprises laminating a second dielectric layer onto the second surface of the core layer, and then forming a plurality of second blind holes in the second dielectric layer. Then a second conductive layer is formed on the second dielectric layer, so as to form a plurality of second conductive vias in the second blind holes, wherein the second conductive vias are electrically connected to the passive component. Thereafter, the second conductive layer is patterned to form the second circuit layer.

According to a preferred embodiment of the present invention, the aforementioned method of forming the second blind holes is, for example, laser drilling.

As embodied and broadly described herein, the present invention provides a circuit carrier including a core layer, a passive component, a plurality of dielectric layers, and a plurality of circuit layers. The core layer has a first surface and a second surface. In addition, the core layer has a hole, and the passive component is embedded inside the hole of the core layer. Furthermore, the circuit layers and the dielectric layers are alternately disposed on the first surface and the second surface respectively. The dielectric layers have a plurality of conductive vias, and at least one of the circuit layers is electrically connected to the passive component through the conductive vias.

According to a preferred embodiment of the present invention, the aforementioned passive component has a plurality of electrodes, which are respectively connected to the conductive vias.

According to a preferred embodiment of the present invention, the aforementioned circuit layer comprises at least one first circuit layer and at least one second circuit layer, wherein the first circuit layer and a part of the dielectric layers are alternately disposed on the first surface of the core layer, and the passive component is electrically connected to the first circuit layer through the conductive vias. In addition, the second circuit layer and other part of the dielectric layers are alternately disposed on the second surface of the core layer.

According to a preferred embodiment of the present invention, the aforementioned circuit layer comprises at least one first circuit layer and at least one second circuit layer, wherein the first circuit layer and a part of the dielectric layers are alternately disposed on the first surface of the core layer. In addition, the second circuit layer and other part of the dielectric layers are alternately disposed on the second surface of the core layer. In particular, the passive component is electrically connected to the first circuit layer and the second circuit layer through the conductive vias.

According to a preferred embodiment of the present invention, the hole of the core layer is, for example, a through hole or a blind hole.

As described above, the circuit carrier of the present invention has an embedded passive component with high electrical specifications. Therefore, the circuit carrier of the present invention has better electrical performance, and also increases the surface area for disposing electronic components. Furthermore, the circuit carrier of the present invention has the embedded passive component of particular specifications embedded in the core layer without changing the circuit layout, so as to satisfy the requirement of circuit design.

In order to make the aforementioned and other objects, features and advantages of the present invention comprehensible, preferred embodiments accompanied with figures are described in detail below.

DESCRIPTION OF EMBODIMENTS

The First Embodiment

Figure 1A:
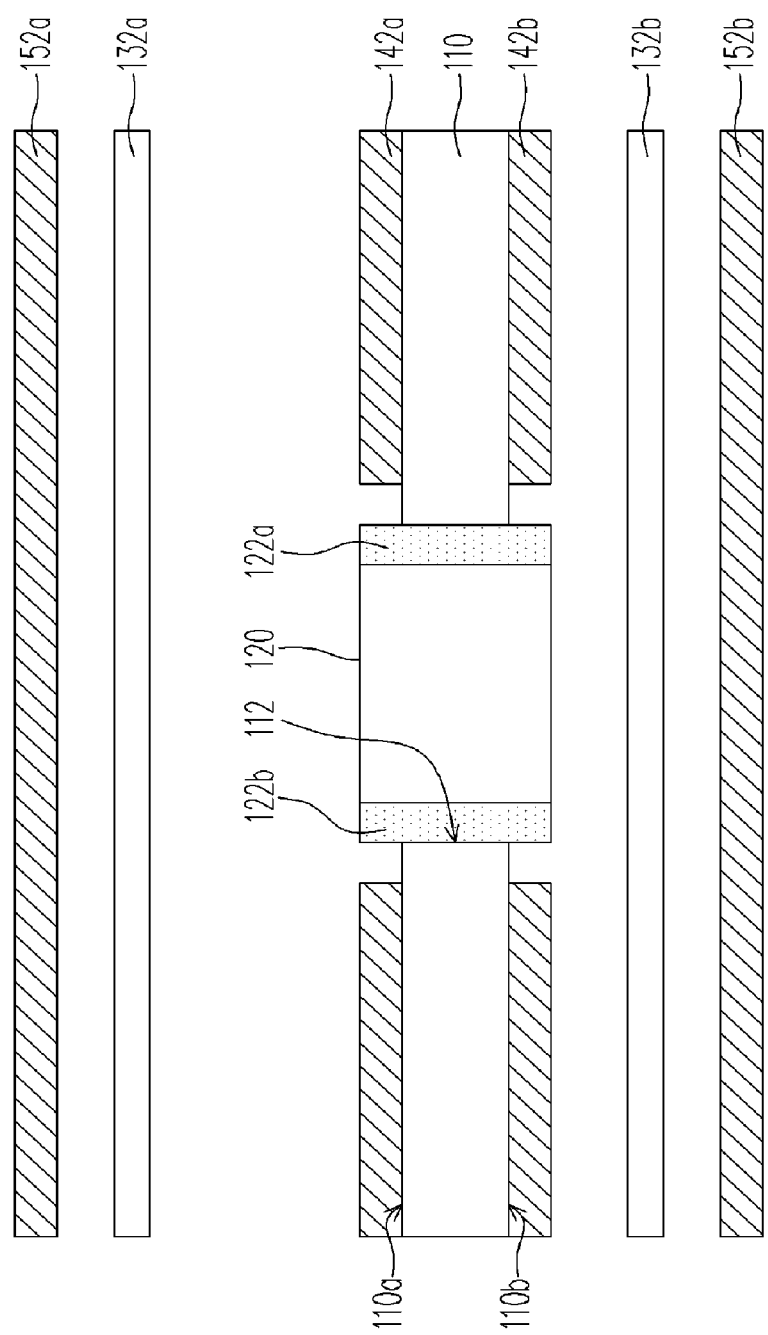
FIGS. 1A to 1C are schematic sectional views of the manufacturing process of the circuit carrier according to the first preferred embodiment of the present invention.
Figure 1B:
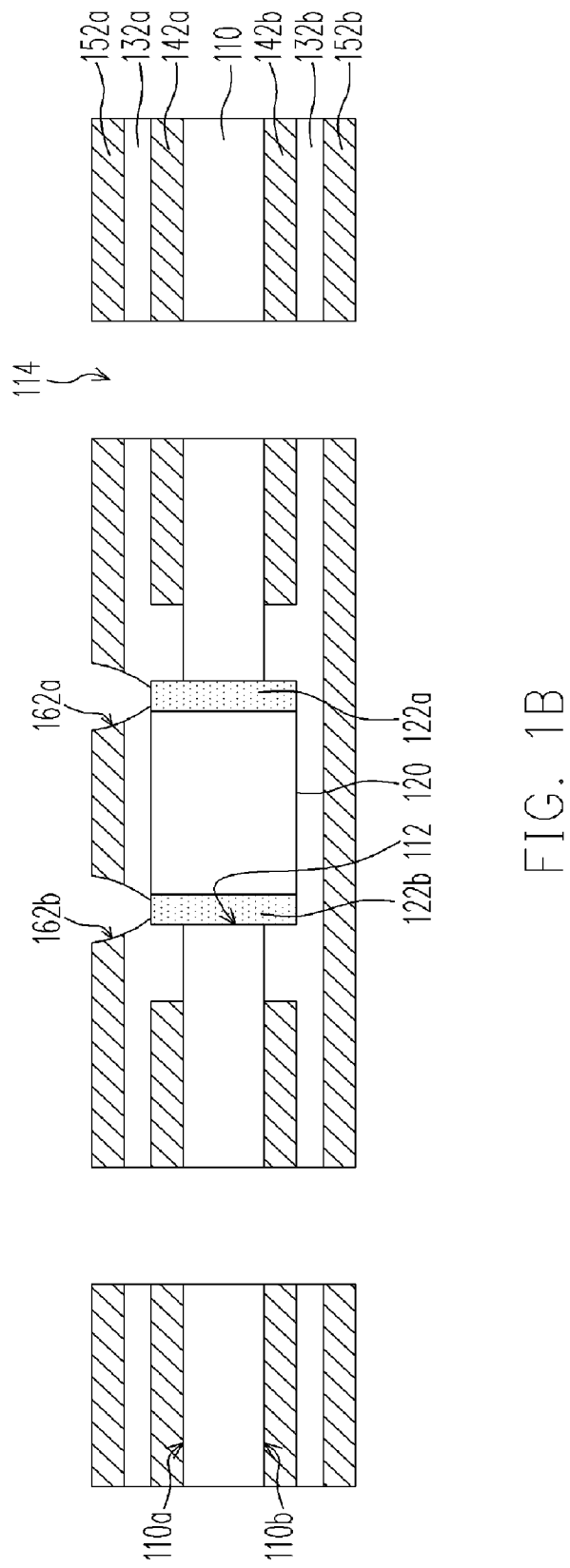
Figure 1C:
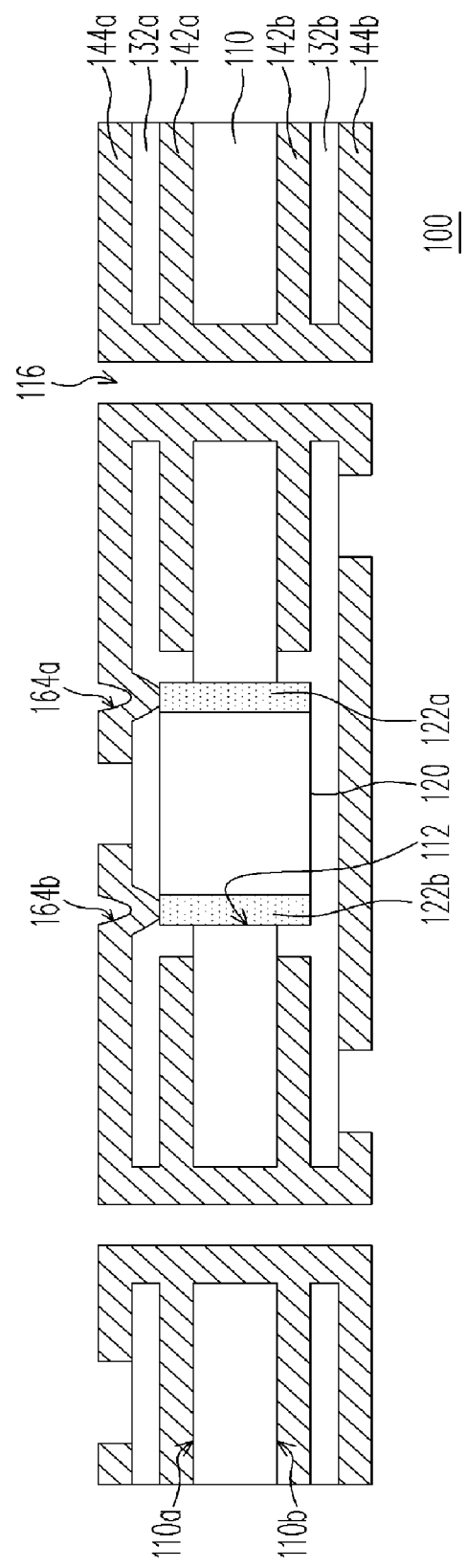

FIGS. 1A to 1C are schematic sectional views of the manufacturing process of the circuit carrier according to the first preferred embodiment of the present invention. Referring to FIG. 1A, the manufacturing process of the circuit carrier of the present embodiment comprises steps as following. First, a core layer 110 having a through hole 112 is provided, wherein the core layer 110 has a first surface 110a and a second surface 110b. The method of forming the through hole 112 of the core layer 110 is, for example, mechanical drilling, laser drilling, or other drilling technique. It should be noted that in the present embodiment, circuit layers 142a and 142b are formed respectively on the first surface 110a and the second surface 110b of the core layer 110. However, it is possible that circuit layers are not formed on the surface of the core layer 110.

Figure 2A:
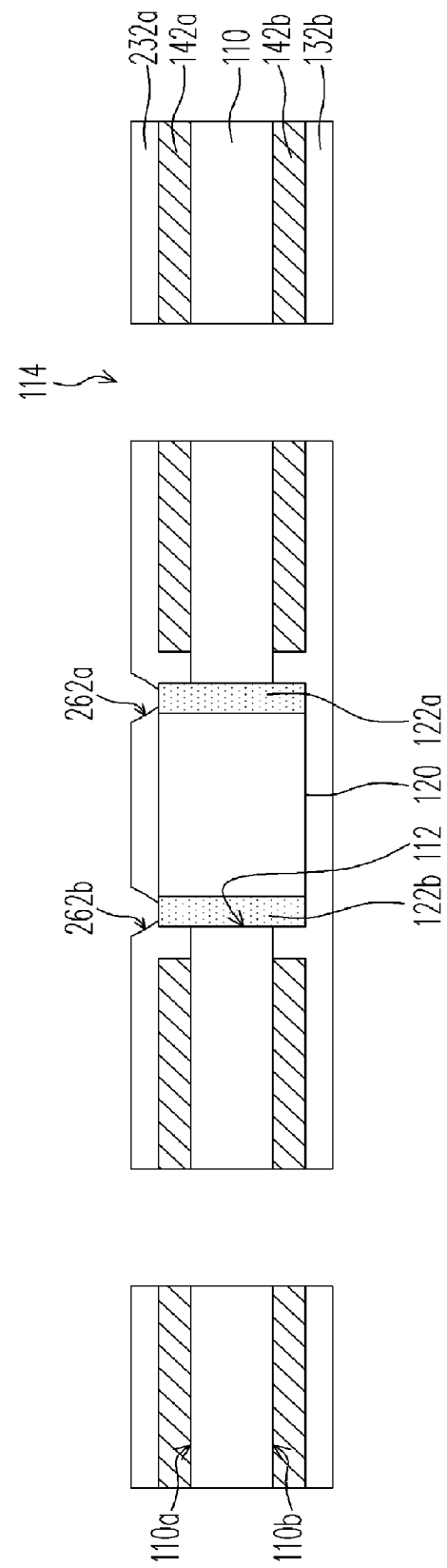
FIGS. 2A to 2B are schematic sectional views of the circuit carrier according to the second preferred embodiment of the present invention.
Figure 2B:
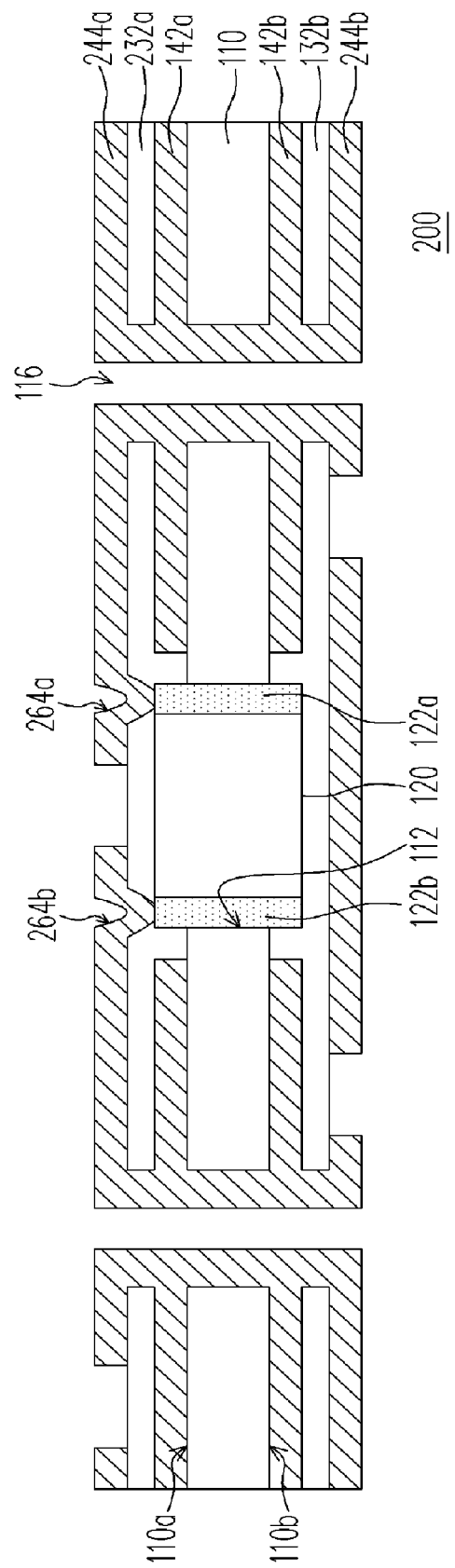

In view of the above, a passive component 120 is embedded in the through hole 112, wherein the passive component 120 has a plurality of electrodes 122a and 122b which are both in contact with dielectric layers 132a and 132b (shown in FIG. 2B). Then a conductive layer 152a and a dielectric layer 132a are disposed on the first surface 110a of the core layer 110, and another conductive layer 152b and another dielectric layer 132b are disposed on the second surface 110b of the core layer 110. The aforementioned dielectric layer 132a is disposed between the conductive layer 152a and the core layer 110, and the dielectric layer 132b is disposed between the conductive layer 152b and the core layer 110.

Referring to FIG. 1B, a pre-lamination process is performed on the above structure to pre-laminate various layers into a sheet-like structure. In detail, the conductive layer 152a and the dielectric layer 132a are stacked alternately on the first surface 110a of the core layer 110, and the conductive layer 152b and the dielectric layer 132b are stacked alternately on the second surface 110b of the core layer 110. It should be noted that before disposing the conductive layer 152a and the dielectric layer 132a on the first surface 110a of the core layer 110, a pre-lamination process is performed on the conductive layer 152a and the dielectric layer 132a, so as to pre-laminate the two layers into a sheet-like structure. Similarly, before laminating the conductive layer 152b and the dielectric layer 132b on the second surface 110b of the core layer 110, a pre-lamination process is performed on the conductive layer 152b and the dielectric layer 132b, so as to pre-laminate the two layers into a sheet-like structure.

Referring to FIG. 1B, a plurality of through holes 114 is formed in the structure formed in the aforementioned process, wherein the method of forming the through holes 114 is, for example, mechanical drilling or laser drilling. In addition, blind holes 162a and 162b are formed in the conductive layer 152a and the dielectric layer 132a, wherein the blind via 162a exposes a part of the surface of the electrode 122a of the passive component 120, and the blind via 162b exposes a part of the surface of the electrode 122b of the passive component 120. For example, the method of forming the blind holes 162a and 162b is laser drilling or other precise drilling techniques.

Referring to FIG. 1C, an electroplating process is performed on the structure formed in the above process, so as to form conductive through holes 116 and conductive vias 164a and 164b. Then, a patterning process is performed on the conductive layer 152a and the conductive layer 152b, so as to form a circuit layer 144a and a circuit layer 144b, respectively. After the circuit layer 144a and the circuit layer 144b are formed, the fabricating of the circuit carrier 100 is substantially completed. It should be noted that the circuit layer 144a is electrically connected to the passive component 120 through the conductive vias 164a and 164b.

In particular, the fabricating method of the circuit layer 144b can also comprise pre-laminating the conductive layer 152b and the dielectric layer 132b, and then performing the patterning process on the conductive layer 152b. Then, the pre-laminated circuit layer 144b and the dielectric layer 132b are laminated onto the second surface 110b of the core layer 110. The detailed structure of the circuit carrier 100 is illustrated below.

Referring to FIG. 1C, the circuit carrier 100 of the present embodiment comprises the core layer 110, the passive component 120, the plurality of dielectric layers 132a and 132b, and the plurality of circuit layers 142a, 142b, 144a, and 144b. In addition, the core layer 110 has a through hole 112, and the passive component 120 is embedded inside the through hole 112 of the core layer 110. Moreover, the circuit layers 142a, 142b, 144a, and 144b and the dielectric layers 132a and 132b are alternately disposed on the first surface 110a and the second surface 110b of the core layer 110 respectively, wherein the circuit layer 144a is electrically connected to the passive component 120.

In detail, the circuit layer 144a is electrically connected to the electrodes 122a and 122b of the passive component 120 respectively through the conductive vias 164a and 164b, wherein the passive component 120 is, for example, an inductor, a capacitor, or a resistor. Moreover, the material of the circuit layers 142a, 142b, 144a, and 144b is a conductive material such as gold and copper. It should be noted that it is not necessary to form the circuit layers 142b and 144b on the second surface 110b of the core layer 110.

Compared with conventional art that disposes the passive component on the surface of the circuit board, as the passive component 120 is embedded in the core layer 110, the circuit carrier 100 of the present invention has better electrical performance. Other electronic components can also be disposed on the surface of the circuit carrier 100. In addition, since the passive component formed by conductive layers and dielectric layers of the circuit layout does not have high electrical specification, the passive component with particular electrical specification is provided and directly embedded in the core layer 110 during the manufacturing process of the circuit carrier of the present invention, so as to satisfy the requirements in design. Furthermore, the manufacturing process of the circuit carrier of the present invention is compatible with the current processes, thus additional processing equipments are not required.

The Second Embodiment

FIGS. 2A to 2B are schematic sectional views of the manufacturing process of the circuit carrier according to the second preferred embodiment of the present invention. Referring to FIG. 2A, the second embodiment is similar to the first embodiment and only the difference therebetween is described herein. During the manufacturing process of the circuit carrier 200, a dielectric layer 232a is laminated on the first surface 110a of the core layer 110, wherein the circuit layers 142a and 142b have been formed respectively on the first surface 110a and the second surface 110b of the core layer 110. However, it is possible that the circuit layers are not formed on the surface of the core layer 110. Then, the through hole 114 and blind holes 262a and 262b are formed in the structure formed in the above manufacturing process, wherein the blind holes 262a and 262b respectively expose the electrodes 122a and 122b of the passive component 120. In addition, the method of forming the blind holes 262a and 262b is, for example, laser drilling or other precise drilling techniques.

Referring to FIG. 2B, an electroplating process is performed on the structure formed in the above manufacturing process, so as to form a conductive material layer (not shown) on the surface of the dielectric layer 232a, and form the conductive through hole 116, and conductive vias 264a and 264b simultaneously. Then, a patterning process is performed on the conductive material layer, so as to form a circuit layer 244a. Therefore, the circuit layer 244a is electrically connected to the passive component 120 through the conductive vias 264a and 264b. It should be noted that the method of forming the circuit layer 244b may be similar to the method of forming the circuit layer 244a, and can also be similar to the method of forming the circuit layer 124b of the first embodiment. In other words, the method of forming the circuit layer 244b is, for example, the lamination process or the build-up process. Similarly, the method of forming the conductive layer 152b of the first embodiment can also be the lamination process or the build-up process.

The Third Embodiment

Figure 3:
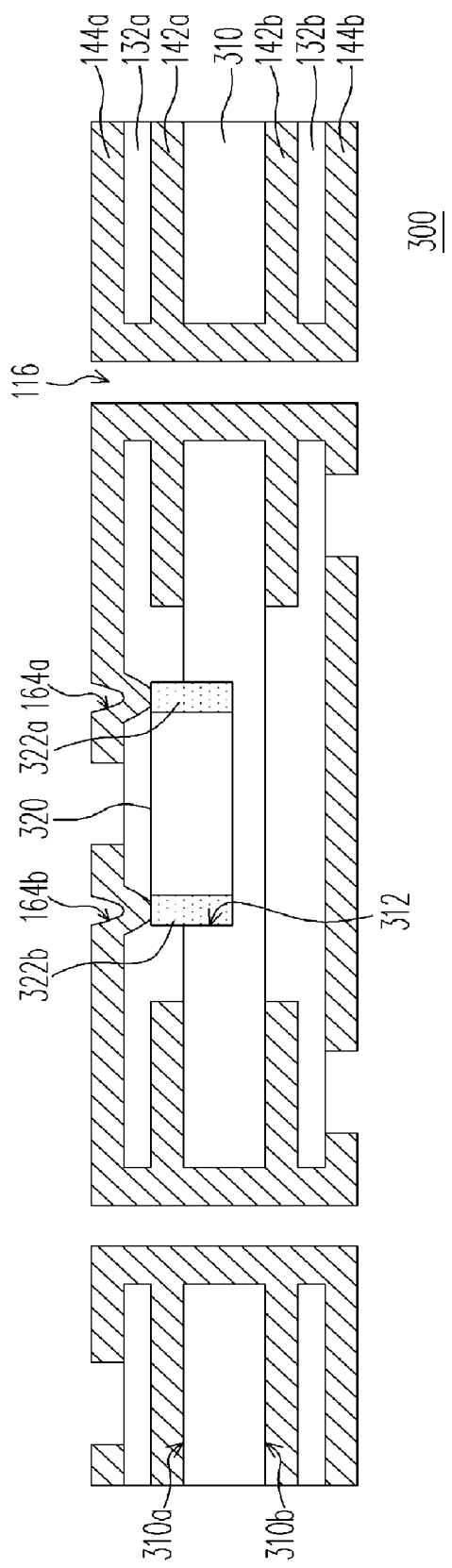
FIG. 3 is a schematic sectional view of the circuit carrier according to the third preferred embodiment of the present invention.

FIG. 3 is a schematic sectional view of the circuit carrier according to the third preferred embodiment of the present invention. Referring to FIG. 3, the third embodiment is similar to the first embodiment and only the difference therebetween is described herein. In the circuit carrier 300 of the third embodiment, the core layer 310 has a blind hole 312, and the passive component 320 is embedded in the blind hole 312. Moreover, the circuit layer 144a is electrically connected to electrodes 322a and 322b of the passive component 320 respectively through the conductive vias 164a and 164b, and the electrodes 322a and 322b are in contact with bumps 150 of the circuit layer 144a.

Referring to FIG. 3, the method of forming the blind hole 312 is, for example, mechanical drilling, laser drilling, or other processes capable of removing a part of the thickness of the core layer 310. It should be noted that it is not necessary to form the circuit layers 142a and 142b on the first surface 310a and the second surface 310b of the core layer 310. In addition, it is not necessary to form the circuit layers 142b and 144b on the second surface 210b. Moreover, the method of forming the circuit layers 144a and 144b is, for example, the lamination process or the build-up process. Furthermore, the method of forming the conductive vias 264a and 264b of the second embodiment can also be applied in the present embodiment.

The Fourth Embodiment

Figure 4:
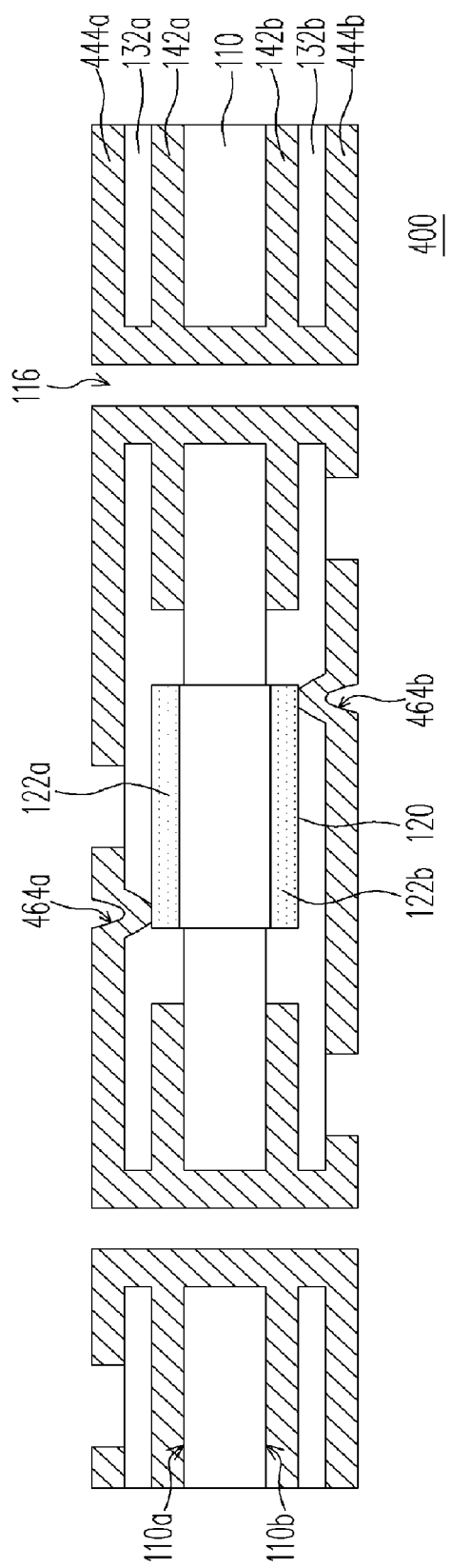
FIG. 4 is a schematic sectional view of the circuit carrier according to the fourth preferred embodiment of the present invention.

FIG. 4 is a schematic sectional view of the circuit carrier according to the fourth preferred embodiment of the present invention. Referring to FIG. 4, the fourth embodiment is similar to the first embodiment and only the difference therebetween is described herein. In the circuit carrier 400 of the fourth embodiment, the passive component 120 is electrically connected to circuit layers 444a and 444b. In detail, the circuit layer 444a is electrically connected to the electrode 122a of the passive component 120 through the conductive via 464a, and the circuit layer 444b is electrically connected to the electrode 122b of the passive component 120 through the conductive via 464b. It should be noted that compared with the passive component 120 of the first embodiment, the passive component 120 of the fourth embodiment rotates by 90 degrees. However, the arrangement of the passive component 120 of the first embodiment can also be applied in the fourth embodiment.

Referring to FIG. 4, the method of forming the circuit layers 444a and 444b is, for example, the lamination process or the build-up process. Furthermore, the method of forming the conductive vias 264a and 264b of the second embodiment can also be applied in the present embodiment. Similarly, it is not necessary to form the circuit layers 142a and 142b on the first surface 110a and the second surface 110b of the core layer 110.

To sum up, the circuit carrier and the manufacturing process of the present invention have at least the following advantages.

1. Compared with the conventional art, the circuit carrier of the present invention has better electrical performance, and can have more electronic components disposed on the surface thereof.

2. Compared with conventional art, the manufacturing process of the circuit carrier of the present invention directly embeds the passive component with particular electrical specification in the core layer so as to adjust the electrical performance of the circuit carrier.

3. The manufacturing process of the circuit carrier of the present invention is compatible with the current processes, and thus additional processing equipments are not required.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing process of a circuit carrier, comprising:

providing a core layer having a hole, wherein the core layer has a first surface and a second surface;

embedding a passive component in the hole; and alternately forming a plurality of dielectric layers and a plurality of circuit layers on the first surface and the second surface of the core layer, and forming a plurality of first conductive vias in the dielectric layers, wherein at least one of the circuit layers is electrically connected to the passive component through the first conductive vias, wherein a method of forming the circuit layer on the core layer comprises:

alternately forming at least one first circuit layer and a part of the dielectric layers on the first surface of the core layer, wherein the passive component is electrically connected to the first circuit layer through the first conductive vias; and alternately forming at least one second circuit layer and other part of the dielectric layers on the second surface of the core layer, wherein a method of forming the first circuit layer on the first surface of the core layer comprises:

laminating a first conductive layer and a first dielectric layer onto the first surface of the core layer, wherein the first dielectric layer is disposed between the first conductive layer and the core layer;

forming a plurality of first blind holes in the first dielectric layer performing an electroplating process to form the first conductive vias; and patterning the first conductive layer to form the first circuit layer.

2. The manufacturing process of the circuit carrier as claimed in claim 1, wherein the hole of the core layer comprises a through hole or a blind hole.

3. The manufacturing process of the circuit carrier as claimed in claim 1, wherein a method of forming the hole of the core layer comprises mechanical drilling or laser drilling.

4. The manufacturing process of a circuit carrier as claimed in claim 1, further comprising pre-laminating die conductive layer and the dielectric layer before laminating the conductive layer and the dielectric layer onto the core layer.

5. The manufacturing process of a circuit carrier as claimed in claim 1, wherein a method for forming the first blind holes comprises laser drilling.

6. The manufacturing process of a circuit carrier as claimed in claim 1, wherein
   the passive component is further electrically connected to the second circuit layer through a plurality of second conductive vias.

7. The manufacturing process of a circuit carrier as claimed in claim 6, wherein a method of forming the second circuit layer on the second surface of the core layer comprises:
   laminating a second conductive layer and a second dielectric layer onto the second surface of the core layer, wherein the second dielectric layer is disposed between the second conductive layer and the core layer;
   forming the second conductive vias in the second dielectric layer, wherein the second conductive vias are electrically connected to the passive component; and
   patterning the second conductive layer to form the second circuit layer.

8. The manufacturing process of a circuit carrier as claimed in claim 7, further comprising pre-laminating the second conductive layer and the second dielectric layer before laminating the second conductive layer and the second dielectric layer onto the core layer.

9. The manufacturing process of a circuit carrier as claimed in claim 7, wherein a method of forming the second conductive vias comprises:
   forming a plurality of second blind holes in the second dielectric layer; and
   performing an electroplating process to form the second conductive vias.

10. The manufacturing process of a circuit carrier as claimed in claim 9, wherein a method of forming the second blind holes comprises laser drilling.

* * * * *